United States Patent
Banerjee et al.

(10) Patent No.: US 8,823,375 B2
(45) Date of Patent: Sep. 2, 2014

(54) SYSTEM AND METHOD FOR GENERATING A MAGNETIC RESONANCE IMAGE USING PROSPECTIVE MOTION CORRECTION AND PARALLEL IMAGING

(75) Inventors: Suchandrima Banerjee, Menlo Park, CA (US); Ajit Shankaranarayanan, San Mateo, CA (US); Philip Beatty, Thornhill (CA); Eric Han, Mountain View, CA (US)

(73) Assignee: General Electric Company, Schenectady, NY (US)

( * ) Notice: Subject to any disclaimer, the term of this patent is extended or adjusted under 35 U.S.C. 154(b) by 418 days.

(21) Appl. No.: 13/342,319

(22) Filed: Jan. 3, 2012

(65) Prior Publication Data

US 2012/0206140 A1    Aug. 16, 2012

Related U.S. Application Data

(60) Provisional application No. 61/428,968, filed on Dec. 31, 2010.

(51) Int. Cl.
*G01R 33/44*    (2006.01)
*G01R 33/561*    (2006.01)
*G01R 33/565*    (2006.01)

(52) U.S. Cl.
CPC ...... *G01R 33/5611* (2013.01); *G01R 33/56509* (2013.01)
USPC ............................. 324/309; 324/307; 324/312

(58) Field of Classification Search
CPC ....................... G01R 33/5611; G01R 33/56509
USPC ........................... 324/307, 309; 382/131, 132
See application file for complete search history.

(56) References Cited

U.S. PATENT DOCUMENTS

| 7,348,776 B1 | 3/2008 | Aksoy et al. | |
| 7,619,410 B2 | 11/2009 | Beatty et al. | |
| 2008/0054899 A1 * | 3/2008 | Aksoy et al. | 324/307 |
| 2013/0278263 A1 * | 10/2013 | Huang et al. | 324/309 |

OTHER PUBLICATIONS

Griswold, Breuer, Blaimer, Kannengiesser, Heidemann, Mueller, Nittka, Jellus, Kiefer and Jakob, "Autocalibrated Coil Sensitivity Estimation for Parallel Imaging", NMR in Biomedicine, (2006), 19; pp. 316-324. www.interscience.wiley.com.

(Continued)

*Primary Examiner* — Melissa Koval
*Assistant Examiner* — Rishi Patel

(57) ABSTRACT

A method for generating a magnetic resonance (MR) image includes acquiring MR data from each of a plurality of RF coils and applying a prospective motion correction method to the MR data for each RF coil including determining a set of motion measurements that include a scan plane orientation associated with each data point in the MR data. The MR data for each RF coil is divided into a plurality of scan plane orientation groups based on motion changes. A set of unaliasing coefficients is generated for each scan plan orientation group and applied to the MR data to synthesize data for each RF coil. The acquired MR data and synthesized data for each RF coil is combined to generate a scan plane orientation data set. Each scan plane orientation data set is combined to generate a complete k-space data set.

16 Claims, 3 Drawing Sheets

(56) References Cited

OTHER PUBLICATIONS

Odille, Cindea, Mandry, Pasquier, Vuissoz and Felblinger, "Generalized MRI Reconstruction Including Elastic Physiological Motion and Coil Sensitivity Encoding", Magnetic Resonance in Medicine 59: (2008), pp. 1401-1411.

Shankaranarayanan, Han, Roddey, White, Busse, Kuperman, Santos, Rettmann, Schmidt and Dale, "Motion Insensitive 3D T2 and T1-weighted imaging with a real-time, image-based PROspective MOtion Correction Technique (3D PROMO) and Automated Re-Acquistion of Motion-Corrupted K-Space Segments", Proc. Intl. Soc. Mag. Reson. Med. 16, (2008); p. 1475.

Shankaranarayanan, Roddey, White, Han, Rettmann, Santos, Schmidt and Dale, "Motion Insensitive 3D Imaging Using a Novel Real-Time Image-Based 3D PROspective MOtion Correction Method (3D PROMO)", Proc. Intl. Soc. Mag. Reson. Med. 15, (2007); p. 2117.

Skare, Newbould, Clayton, Albers, Nagle and Bammer, "Clinical Multishot DW-EPI Through Parallel Imaging With Considerations of Susceptibility, Motion, and Noise", Magnetic Resonance in Medicine: 57, (2007); pp. 881-890.

Busse, Brau, Vu, Michelich, Bayram, Kijowski, Reeder and Rowley, "Effects of Refocusing Flip Angle Modulation and View Ordering in 3D Fast Spin Echo", Magnetic Resonance in Medicine: 60, (2008); pp. 640-649.

Bammer, Aksoy and Liu, "Augmented Generalized SENSE Reconstruction to Correct for Rigid Body Motion", Magnetic Resonance in Medicine: 57, (2007); pp. 90-102.

Odille, Vuissoz, Marie and Felblinger, "Generalized Reconstruction by Inversion of Coupled Systems (GRICS) Applied to Free-Breathing MRI", Magnetic Resonance in Medicine: 60, (2008); pp. 146-157.

\* cited by examiner

SYSTEM AND METHOD FOR GENERATING A MAGNETIC RESONANCE IMAGE USING PROSPECTIVE MOTION CORRECTION AND PARALLEL IMAGING

CROSS REFERENCE TO RELATED APPLICATION

The present application claims the benefit of U.S. Provisional Application Ser. No. 61/428,968, filed Dec. 31, 2010, herein incorporated by reference in its entirety.

TECHNICAL FIELD

The present invention relates generally to magnetic resonance imaging (MRI) systems and in particular, to a system and method for generating magnetic resonance images using prospective motion correction and parallel imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MR images may be created by applying currents to the gradient and RF coils according to known algorithms called "pulse sequences." The selection of a pulse sequence determines the relative appearance of different tissue types in the resultant images. Various properties of tissue may be used to create images with a desirable contrast between different tissues.

One technique that has been developed to accelerate MR data acquisition is commonly referred to as "parallel imaging" or "partial parallel imaging". Various parallel imaging methods exist, including Simultaneous Acquisition of Spatial Harmonics (SMASH), Automatic Simultaneous Acquisition of Spatial Harmonics (AUTO-SMASH), Generalized Autocalibrating Partially Parallel Acquisition (GRAPPA), Parallel Magnetic Resonance Imaging with Adaptive Radius in k-space (PARS), Autocalibrating Reconstruction for Cartesian Sampling (ARC), and Anti-aliasing Partially Parallel Encoded Acquisition Reconstruction (APPEAR), among others. In parallel imaging, multiple receive coils acquire data from a region or volume of interest, where the data is undersampled, for example, in a phase-encoding direction so that only a fraction of k-space data is acquired in an image scan. Thus, parallel imaging is used to accelerate data acquisition in one or more dimensions by exploiting the spatial dependence of phased array coil sensitivity. Parallel imaging has not only been shown to be successful in reducing scan time, but also reducing image blurring and geometric distortions. Moreover, parallel imaging can be used to improve spatial or temporal resolution as well as provide increased volumetric coverage.

Parallel imaging may be used to increase the scan time efficiency of three dimensional (3D) MRI scans. However, 3D MRI scans are susceptible to motion artifacts because scan times are often long even after acceleration with parallel imaging and because any subject motion during the 3D scan potentially affects the entire volume measurement and image quality of the entire acquired volume. Prospective motion correction techniques can be used to reduce motion-related artifacts in MR images. Prospective motion correction methods are implemented during image acquisition. Such methods estimate motion in the volume of interest and adjust the scan coordinates for each acquired k-space data segment accordingly so that the scan coordinates realign with the target volume in the event of motion. The adjustment of scan coordinates to align with the moving subject, however, effectively results in a stationary object and moving coil condition (assuming a rigid coil), yielding different coil sensitivity weightings for the data acquired before and after realignment. Because the unaliasing coefficients in parallel imaging depend directly or indirectly on coil sensitivity, employment of conventional parallel imaging techniques to prospective motion corrected data leads to erroneous image reconstruction, manifested in the resultant images as aliasing and other artifacts.

It would be desirable to have a system and method for generating MR images using both prospective motion correction and parallel imaging.

BRIEF DESCRIPTION OF THE INVENTION

In accordance with an embodiment, a method for generating a magnetic resonance (MR) image includes acquiring MR data from each of a plurality of RF coils, applying a prospective motion correction method to the MR data for each of the plurality of RF coils including determining a set of motion measurements, the set of motion measurements including a scan plane orientation associated with each data point in the MR data, determining motion changes based on the set of motion measurements and a predetermined threshold, dividing the MR data for each of the plurality of RF coils into a plurality of scan plane orientation groups based on the motion changes, generating a set of unaliasing coefficients for each scan plan orientation group, for each scan plane orientation group, applying a set of unaliasing coefficients to the MR data to synthesize data for each RF coil, for each scan plane orientation group, combining the acquired MR data and synthesized data for each RF coil to generate a scan plane orientation data set, combining each scan plane orientation data set to generate a complete k-space data set and generating an image based on the complete k-space data set.

In accordance with another embodiment a magnetic resonance imaging (MRI) system includes a resonance assembly comprising a plurality of gradient coils and a plurality of RF coils, an RF transceiver system coupled to the plurality of RF coils and configured to receive magnetic resonance (MR) data from the plurality of RF coils and a controller programmed to acquire MR data from each of the plurality of RF coils, apply a prospective motion correction method to the MR data for each of the plurality of RF coils including determining a set of motion measurements, the set of motion measurements including a scan plane orientation associated with each data point in the MR data, determine motion changes based on the set of motion measurements and a predetermined threshold, divide the MR data for each of the plurality of RF coils into a plurality of scan plane orientation groups based on the motion changes, generate a set of unaliasing coefficients for each scan plan orientation group, for each scan plane orientation group, apply a set of unaliasing coefficients to synthesize data for each RF coil, for each scan plane orientation group, combine the acquired MR data and synthesized data for each RF coil to generate a scan plane orientation data set, combine each scan plane orientation data set to generate a complete k-space data set and generate an image based on the complete k-space data set.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
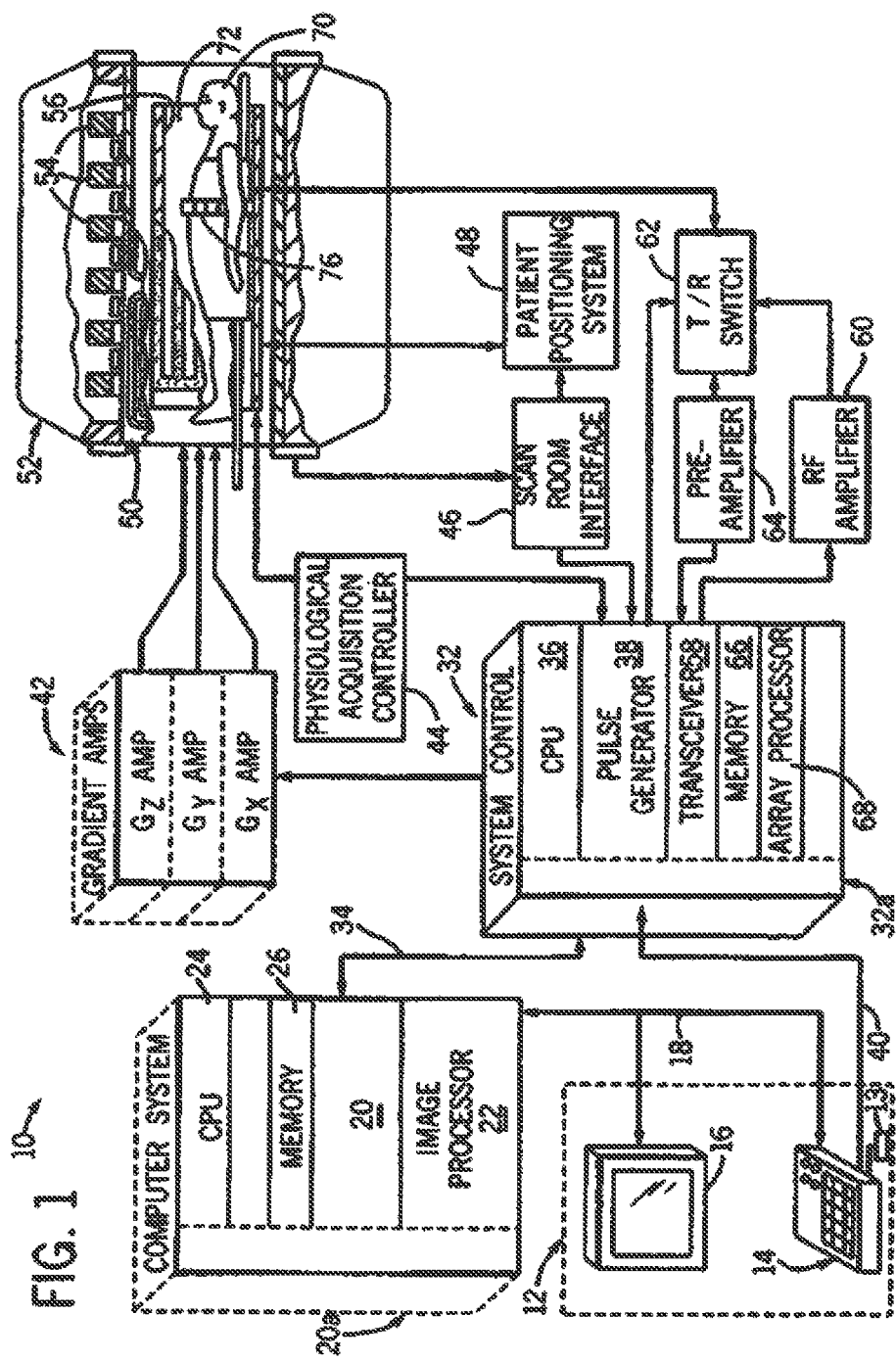
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing magnet 54 and a whole-body RF coil 56, surface or parallel imaging coils 76 or both. The coils 56, 76 may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RE amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored in the memory module 66 until they are subsequently transformed to create images. An array processor 68 uses a known transformation method, most commonly a Fourier transform, to create images from the MR signals. System control computer 32 (and/or computer 20) may also be configured to perform an image reconstruction process as described further below. The images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

As mentioned, the MRI system 10 may include parallel imaging coils 76. Such coils 76 may be used for an autocalibrated parallel imaging technique, which calculates reconstruction weights or unaliasing coefficients necessary to synthesize unacquired data directly from acquired data in k-space. In autocalibration based techniques, the weights or unaliasing coefficients are calculated from fully sampled calibration data that may be embedded within the scan (i.e., "self-calibrated"), but can also be acquired before or after the scan. Parallel imaging coils 76 may be an array of RF receiver coil elements in which each RF receiver coil element separately detects MRI signals.

Figure 2:
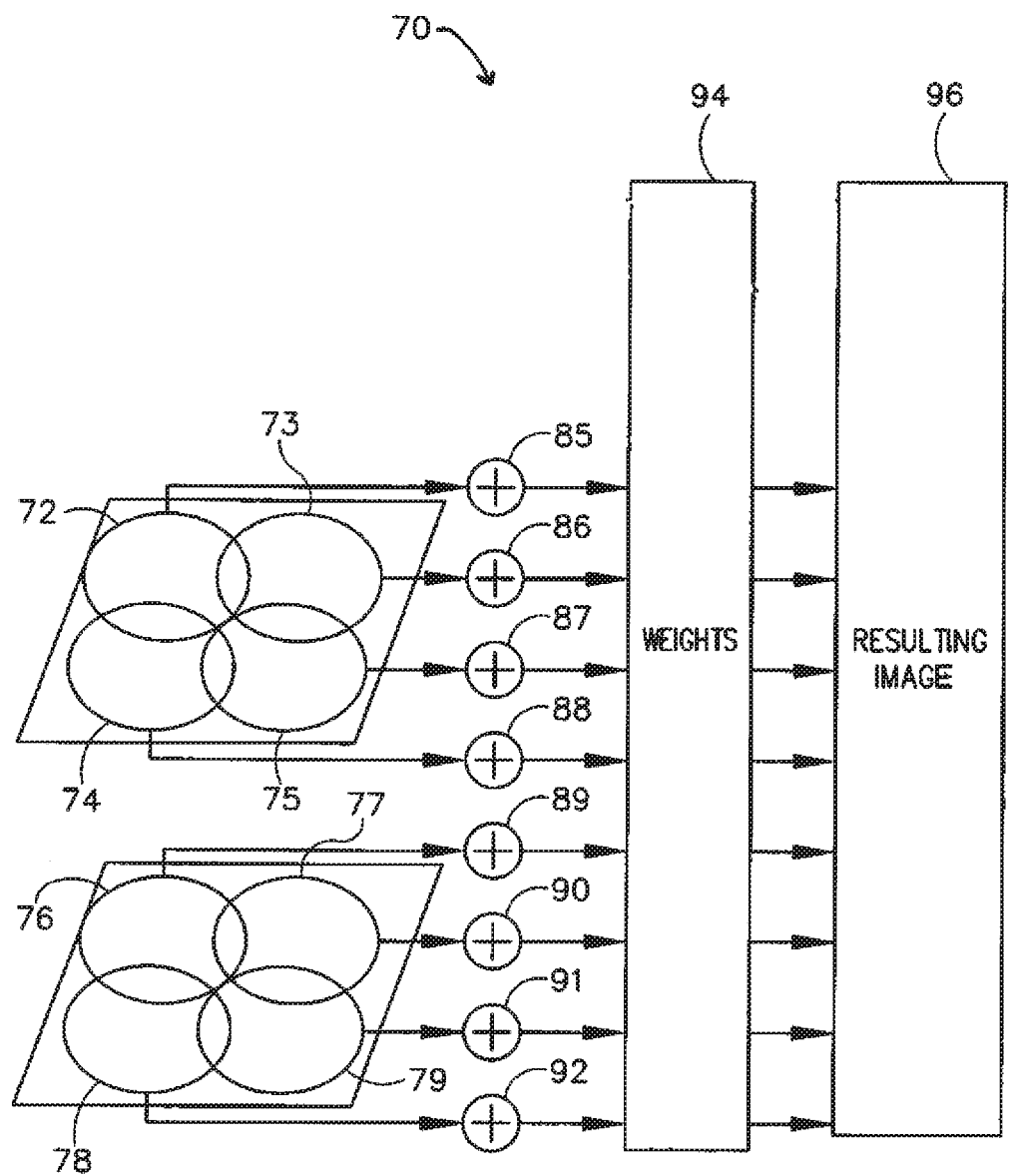
FIG. 2 is schematic block diagram of an exemplary RF coil array useful in an autocalibrating parallel imaging technique in accordance with an embodiment.

FIG. 2 is a schematic block diagram of an exemplary RF coil array useful in an autocalibrating parallel imaging technique in accordance with an embodiment. RF coil array 70 is used to acquire imaging data for a field of view (FOV) and includes eight separate coil elements 72-79 (i.e., receiver coils). It is contemplated, however, that the coil array 70 may include more or less than eight coil elements. One skilled in the art will appreciate that the array illustrated in FIG. 2 is exemplary and many other receiver coil geometries may be used in accordance with embodiments. Each coil element 72-79 samples the FOV by detecting changes in excited nuclei in the FOV and transmits signals indicative of that which is detected to separate data acquisition channels 85-92, respectively. Typically, the scan is an overall undersampled acquisition with a small region that is fully sampled (i.e., calibration data). Calibration data (e.g., fully sampled data from a region of k-space) from each channel 85-92 is used to generate synthesis (or reconstruction) weights or unaliasing coefficients 94. The reconstruction weights of coefficients 94 allow the unacquired data for undersampled regions of k-space to be synthesized from the acquired data in k-space. The acquired and synthesized data may be used to generate an image or images 96 using as method as described below with respect to FIG. 3.

Figure 3:
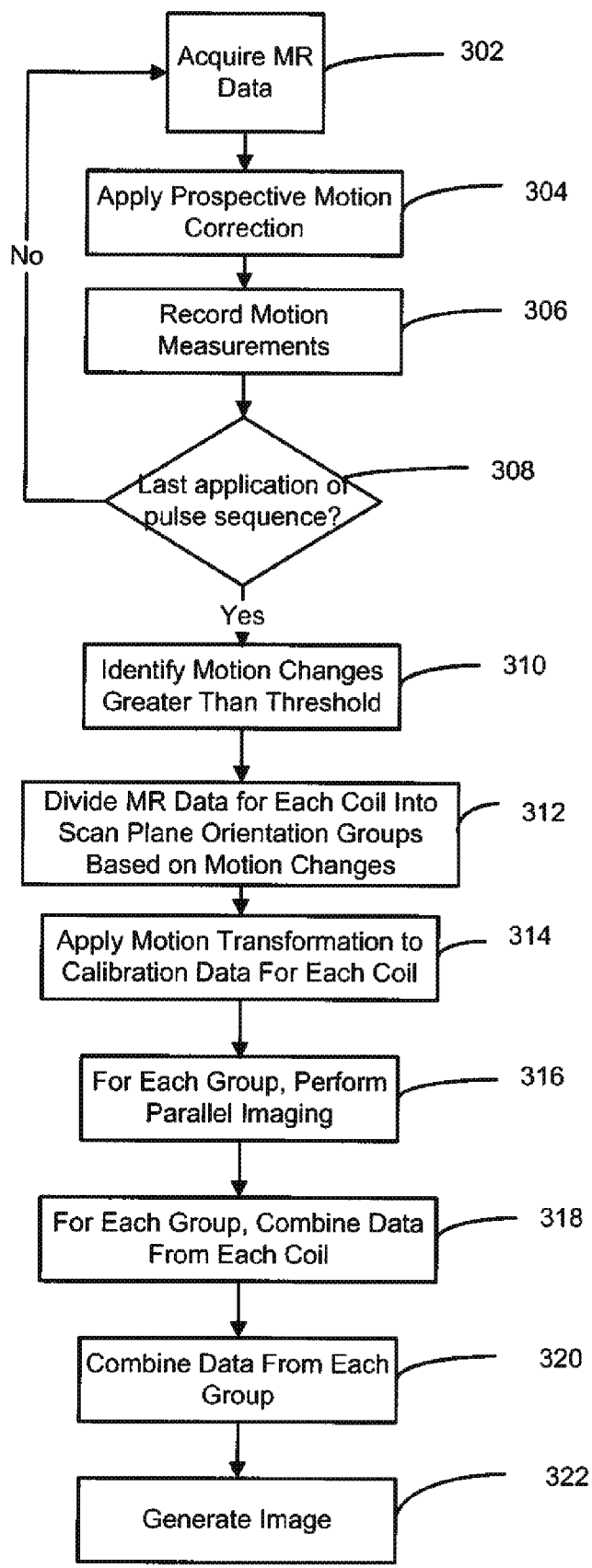
FIG. 3 illustrates a method for generating MR images using prospective motion correction and parallel imaging in accordance with an embodiment.

FIG. 3 illustrates a method for generating MR images using prospective motion correction and parallel imaging in accordance with an embodiment. At block 302, a pulse sequence is applied using an MRI system, for example, MRI system 10 in FIG. 1, to acquire MR data from a subject. In a preferred embodiment, the pulse sequence is a three dimensional (3D) pulse sequence for a volumetric MRI scan. The pulse sequence may be played out repeatedly to acquire the entire set of MR data. In addition, for parallel imaging, data is acquired from each RF coil in a plurality or array of RF coils in the MR system as described above with respect to FIG. 2. In addition, calibration data may be acquired for use with the parallel imaging acquisition as described below.

At block 304, a prospective motion correction technique is applied, typically in between pulse sequence play outs to correct for motion. Any known prospective motion correction method may be used. Typically, a prospective motion correction method estimates motion in the volume of interest and adjusts the scan coordinates for each acquired k-space data segment accordingly so that the scan coordinates realign with the target volume in the event of motion. The motion measurements made by the prospective motion correction method are stored at block 306 and associated with the acquired data. For example, a scan plane orientation (or scan plane reference) may be associated with each data point acquired. In addition, the motion measurements may include rotational and translational motion information. If the last application of the pulse sequence for data acquisition has not been reached at block 308, then the process returns to block 302 to continue data acquisition. If the data acquisition is complete at block 308, then at block 310 motion changes are identified. In particular, the motion measurements between adjacently acquired data points are compared to identify any motion that exceeds a predetermined threshold. The predetermined threshold may vary depending on the parameters of the scan being performed. An example of a rotational motion threshold may be a change greater than 10° of rotation along the x, y or z axis. An example of a translational motion threshold may be a change greater than 4 mm. In an embodiment, the data for each of the RF coils is measured simultaneously and have the same sequence of data acquisition so that the motion measurements and motion changes will be the same for each coil.

Based on the identified motion changes, the acquired MR data for each coil is divided into a plurality of scan plane orientation groups at block 312. The data in each scan plane orientation group has similar motion parameters and scan reference frames. In an example, if twenty (20) data points are acquired for each RF coil and only one motion change exceeding a threshold occurs for the 11th data point, data points 1-10 for each coil are associated with a first scan plane orientation group and data points 11-20 for each coil are associated with a second scan plane orientation group. At block 314, the motion transformation (e.g., the motion measurements) is applied to a set of calibration data for each coil to align the calibration data and correct for motion. As known for various data driven parallel imaging techniques (e.g., ARC), the calibration data may be acquired during the data acquisition or before the data acquisition.

At block 316, for each scan plane orientation group (which includes the same set of data points from each RF coil), a parallel imaging method is applied to the acquired data to synthesize missing (or unacquired) data points. In a preferred embodiment, the parallel imaging method is a data driven parallel imaging method such as, for example, ARC. The motion corrected calibration data from block 314 is used to synthesize the missing (or unacquired) data, for example, a set of unaliasing coefficients may be generated based on the motion corrected calibration data and then applied to the coil data in the scan plane orientation group. At block 318, for each scan plane orientation group, the data (acquired and synthesized) for multiple coils is combined using known techniques (e.g., match filter combination). At block 320, the data from each scan plane orientation group is combined to form a single complete fully-sampled data set using known methods (e.g., complex addition). An image is then generated at block 322 from the single set of data from block 320. The image may be generated (or reconstructed) using known techniques.

For a prospective motion corrected sequence that is accelerated by a data driven parallel imaging technique, the method described above processes the k-space data that is acquired in considerably different scan reference frames using different unaliasing coefficients. Accordingly, data that are acquired in similar scan reference frames are grouped together and sent to the same parallel imaging pipeline.

Computer-executable instructions for generating a magnetic resonance image according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

A technical effect of the disclosed method and apparatus is that it provides for a computer-implemented technique for generating MR images using prospective motion correction and parallel imaging.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for generating a magnetic resonance (MR) image, the method comprising:
   acquiring MR data from each of a plurality of RF coils;
   applying a prospective motion correction method to the MR data for each of the plurality of RF coils including determining a set of motion measurements, the set of motion measurements including a scan plane orientation associated with each data point in the MR data;
   determining motion changes based on the set of motion measurements and a predetermined threshold;
   dividing the MR data for each of the plurality of RF coils into a plurality of scan plane orientation groups based on the motion changes;
   generating a set of unaliasing coefficients for each scan plane orientation group;
   for each scan plane orientation group, applying a set of unaliasing coefficients to the MR data to synthesize data for each RF coil;
   for each scan plane orientation group, combining the acquired MR data and synthesized data for each RF coil to generate a scan plane orientation data set;
   combining each scan plane orientation data set to generate a complete k-space data set; and
   generating an image based on the complete k-space data set.

2. A method according to claim 1, wherein the MR data for each RF coil includes a set of calibration data.

3. A method according to claim 2, further comprising generating the set of unaliasing coefficients based on the set of calibration data.

4. A method according to claim 3, further comprising correcting the set of unaliasing coefficients motion changes based on the prospective motion correction.

5. A method according to claim 1, wherein the MR data is acquired using a three dimensional pulse sequence acquisition.

6. A method according to claim 1, wherein the MR data is acquired using multiple applications of a pulse sequence.

7. A method according to claim 1, wherein the set of motion measurements includes rotational and translation motion.

8. A method according to claim 1, wherein the MR data comprises undersampled data.

9. A magnetic resonance imaging (MRI) system comprising:
   a resonance assembly comprising a plurality of gradient coils and a plurality of RF coils;
   an RF transceiver system coupled to the plurality of RF coils and configured to receive magnetic resonance (MR) data from the plurality of RF coils; and
   a controller programmed to:
      acquire MR data from each of the plurality of RF coils;
      apply a prospective motion correction method to the MR data for each of the plurality of RF coils including determining a set of motion measurements, the set of motion measurements including a scan plane orientation associated with each data point in the MR data;
      determine motion changes based on the set of motion measurements and a predetermined threshold;
      divide the MR data for each of the plurality of RF coils into a plurality of scan plane orientation groups based on the motion changes;
      generate a set of unaliasing coefficients for each scan plane orientation group;
      for each scan plane orientation group, apply a set of unaliasing coefficients to synthesize data for each RF coil;
      for each scan plane orientation group, combine the acquired MR data and synthesized data for each RF coil to generate a scan plane orientation data set;
      combine each scan plane orientation data set to generate a complete k-space data set; and
      generate an image based on the complete k-space data set.

10. An MRI system according to claim 9, wherein the MR data for each RF coil includes a set of calibration data.

11. An MRI system according to claim 10, wherein the controller is further programmed to generate the set of unaliasing coefficients based on the set of calibration data.

12. An MRI system according to claim 11, wherein the controller is further programmed to correct the set of unaliasing coefficients motion changes based on the prospective motion correction.

13. An MRI system according to claim 9, wherein the MR data is acquired using a three dimensional pulse sequence acquisition.

14. An MRI system according to claim 9, wherein the MR data is acquired using multiple applications of a pulse sequence.

15. An MRI system according to claim 9, wherein the set of motion measurements includes rotational and translation motion.

16. An MRI system according to claim 9, wherein the MR data comprises undersampled data.

\* \* \* \* \*